United States Patent [19]
Krutsick

[11] Patent Number: 6,066,884
[45] Date of Patent: May 23, 2000

[54] SCHOTTKY DIODE GUARD RING STRUCTURES

[75] Inventor: Thomas J. Krutsick, Blandon, Pa.

[73] Assignee: Lucent Technologies Inc.

[21] Appl. No.: 09/273,299

[22] Filed: Mar. 19, 1999

[51] Int. Cl.⁷ .......................... H01L 27/095; H01L 29/47; H01L 29/812; H01L 31/07; H01L 31/108
[52] U.S. Cl. .......................... 257/484; 257/483; 257/495
[58] Field of Search .................................. 257/471, 474, 257/476, 480, 481, 483, 484, 490, 494, 495

[56] References Cited

U.S. PATENT DOCUMENTS

| | | |
|---|---|---|
| 3,694,719 | 9/1972 | Saxena . |
| 4,607,270 | 8/1986 | Iesaka . |
| 4,618,871 | 10/1986 | Mitlehner . |
| 4,862,229 | 8/1989 | Mundy et al. . |
| 5,804,849 | 9/1998 | Wennekers .............................. 257/280 |
| 5,859,465 | 1/1999 | Spring et al. ........................... 257/484 |

*Primary Examiner*—Ngân V. Ngô

[57] ABSTRACT

The specification describes Schottky barrier devices with distributed guard rings. In one embodiment the guard ring only partially overlaps the barrier. In another embodiment the guard ring is spaced from the barrier throughout, but separated by an MOS gate so that the guard ring and barrier are connected at low bias by an inversion layer.

4 Claims, 6 Drawing Sheets

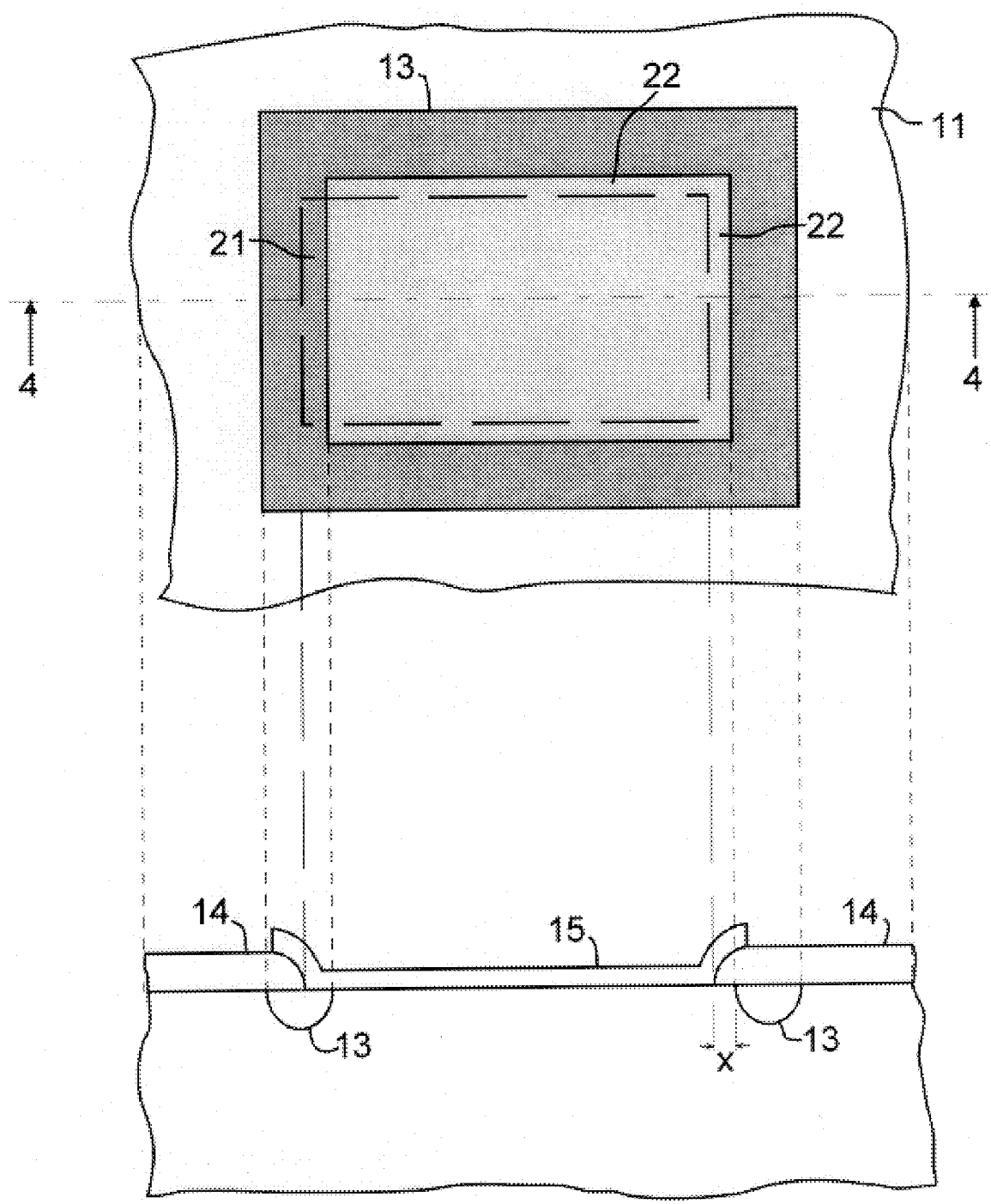

FIG. 5
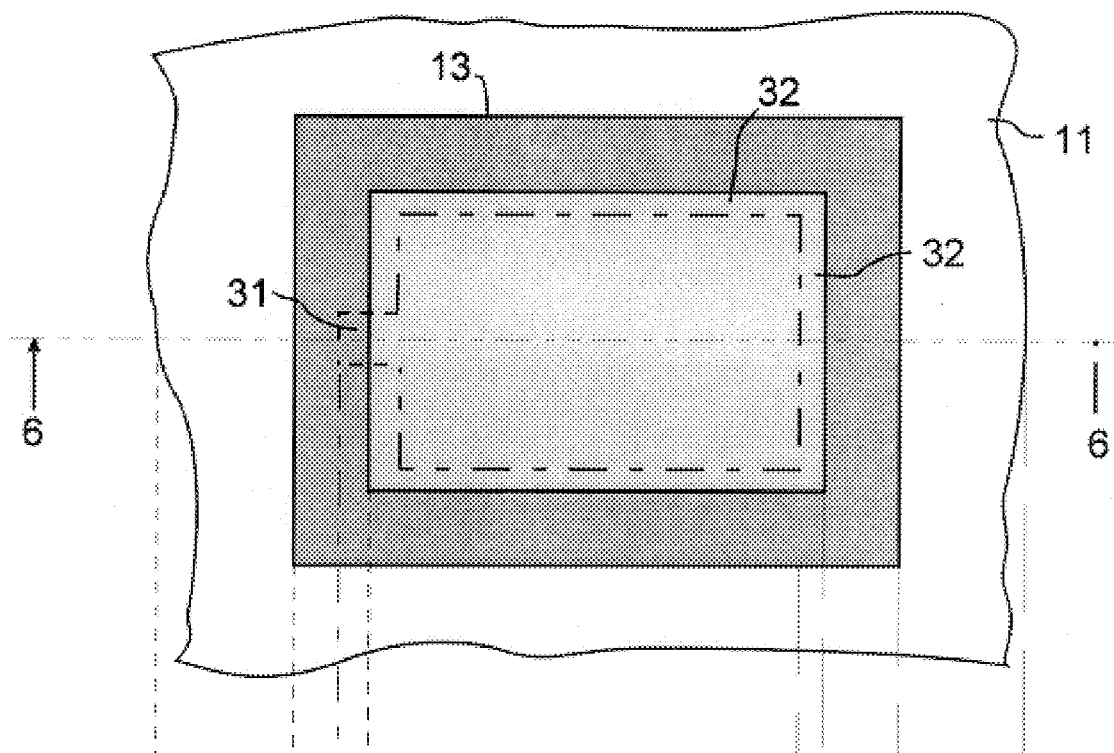
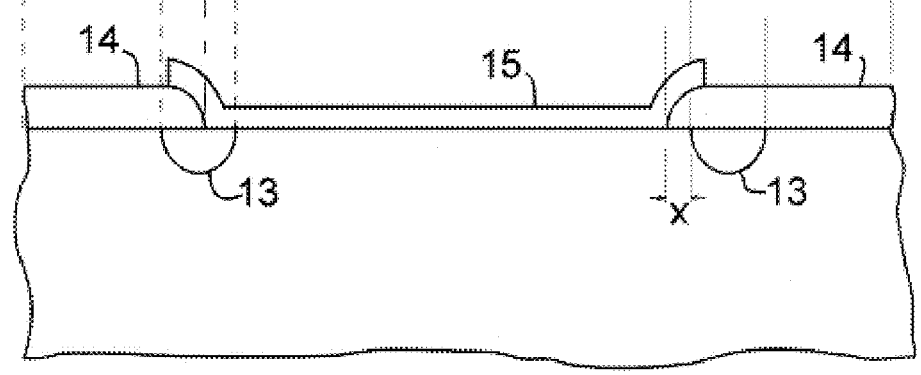
FIG. 6

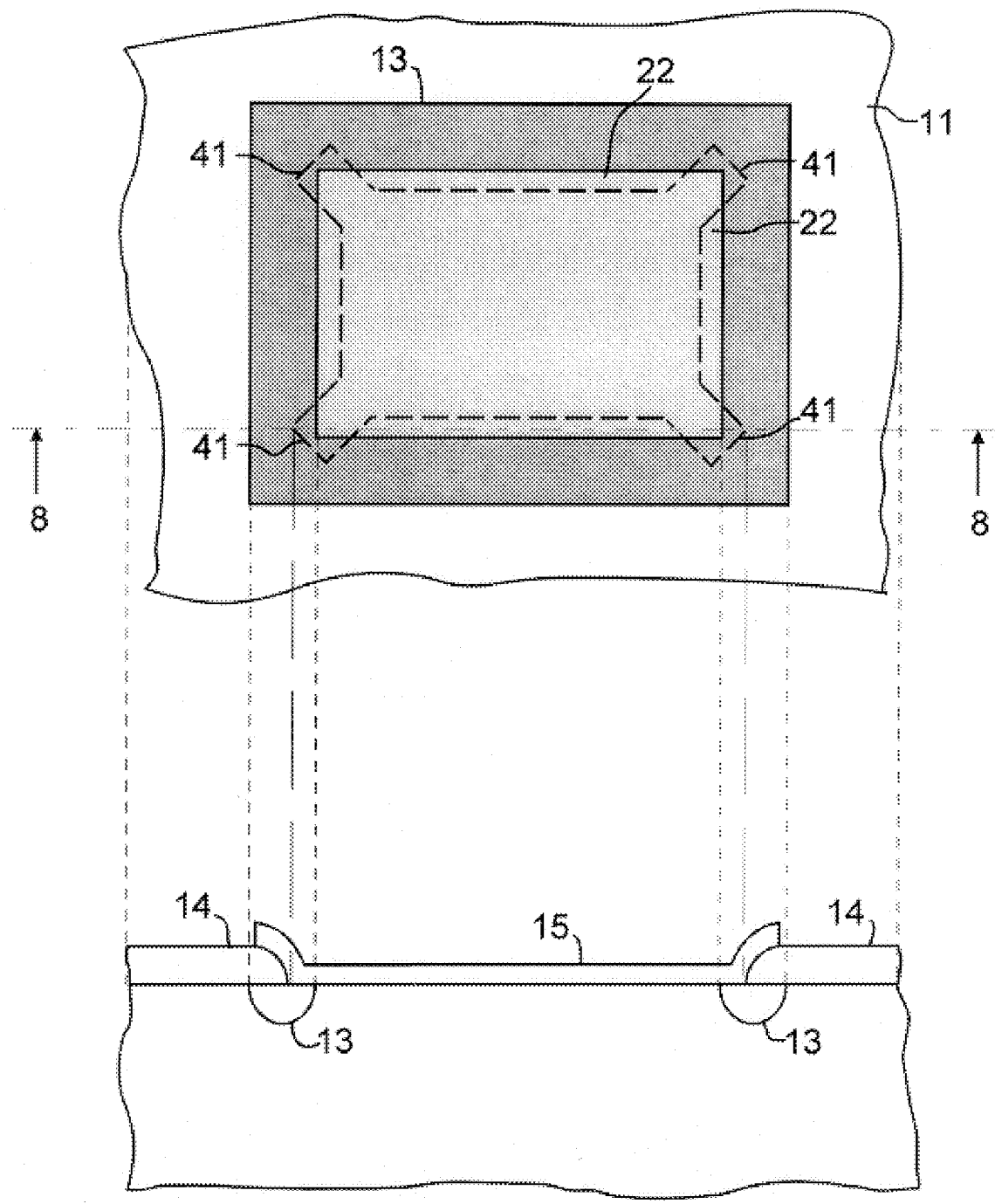

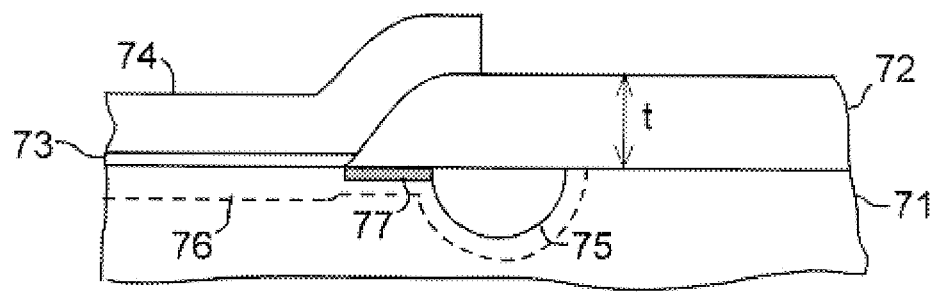
FIG. 9
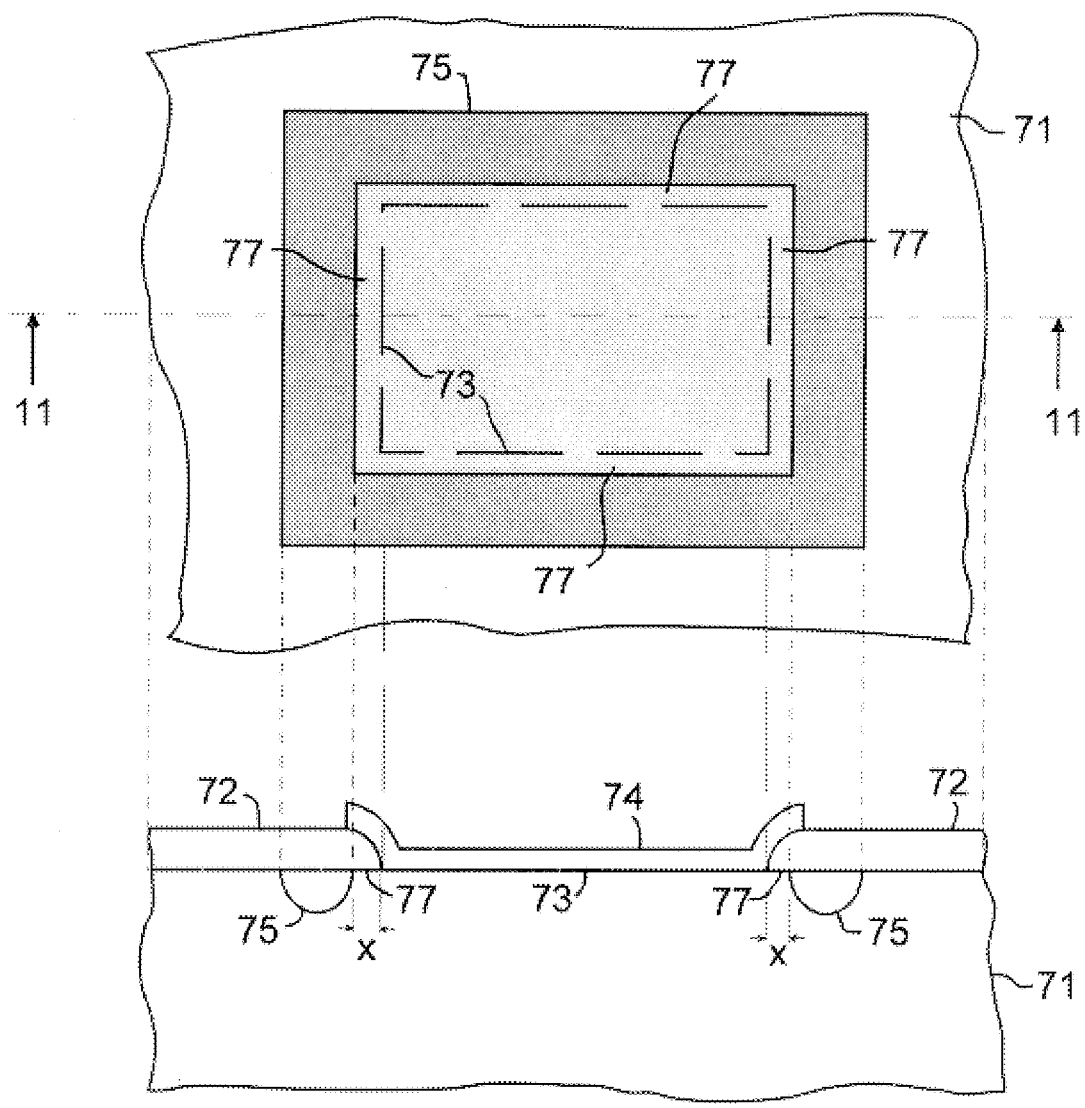
FIG. 10
FIG. 11

SCHOTTKY DIODE GUARD RING STRUCTURES

FIELD OF THE INVENTION

This invention relates to Schottky diodes and to methods for their manufacture. More specifically it relates to Schottky diodes with improved guard rings.

BACKGROUND OF THE INVENTION

Schottky diodes are used widely in electronic systems such as amplifiers, receivers, control and guidance systems, power and signal monitors, and as rectifiers and clamps in RF circuits. Commercial applications include radiation detectors, imaging devices, and wired and wireless communications products. High frequency Schottky diodes may be GaAs devices, and frequently are discrete devices. RF Schottky diodes can also be silicon devices, which may be integrated in silicon integrated circuits.

To improve leakage characteristics, high performance Schotkky diodes are provided with junction guard rings. These devices provide excellent breakdown characteristics in both forward and reverse bias, but the switching speed of junction guarded devices is limited by minority carrier injection from the junction. Thus there appears to be an unavoidable design tradeoff between breakdown voltage and switching speed in junction guarded Schottky diodes.

STATEMENT OF THE INVENTION

I have discovered a Schottky diode device structure that inherently reduces sharp edge breakdown, but also limits diode leakage and therefore provides breakdown performance nearly equivalent to that for diodes with the standard guard ring design. This is accomplished according to the invention by using a distributed guard ring, where the ring is spaced from the active Schottky barrier over a substantial portion of the ring.

BRIEF DESCRIPTION OF THE DRAWING

FIG. 3 is a plan view of a Schottky barrier diode with a junction guard ring according to one embodiment of the invention;

FIG. 4 is a sectional view through 4—4 of FIG. 3;

FIG. 5 is a plan view of a Schottky barrier diode with a junction guard ring according to another embodiment of the invention;

FIG. 6 is a sectional view through 6—6 of FIG. 5;

FIG. 7 is a plan view of a Schottky barrier diode with a junction guard ring according to yet another embodiment of the invention;

FIG. 8 is a sectional view through 8—8 of FIG. 7;

FIG. 9 is a diagram showing the gap region between the guard ring and the Schottky barrier in greater detail;

FIG. 10 is a plan view of a Schottky barrier diode with a junction guard ring according to a further embodiment of the invention;

FIG. 11 is a sectional view through 11—11 of FIG. 10; and

DETAILED DESCRIPTION

Figures 1, 2:
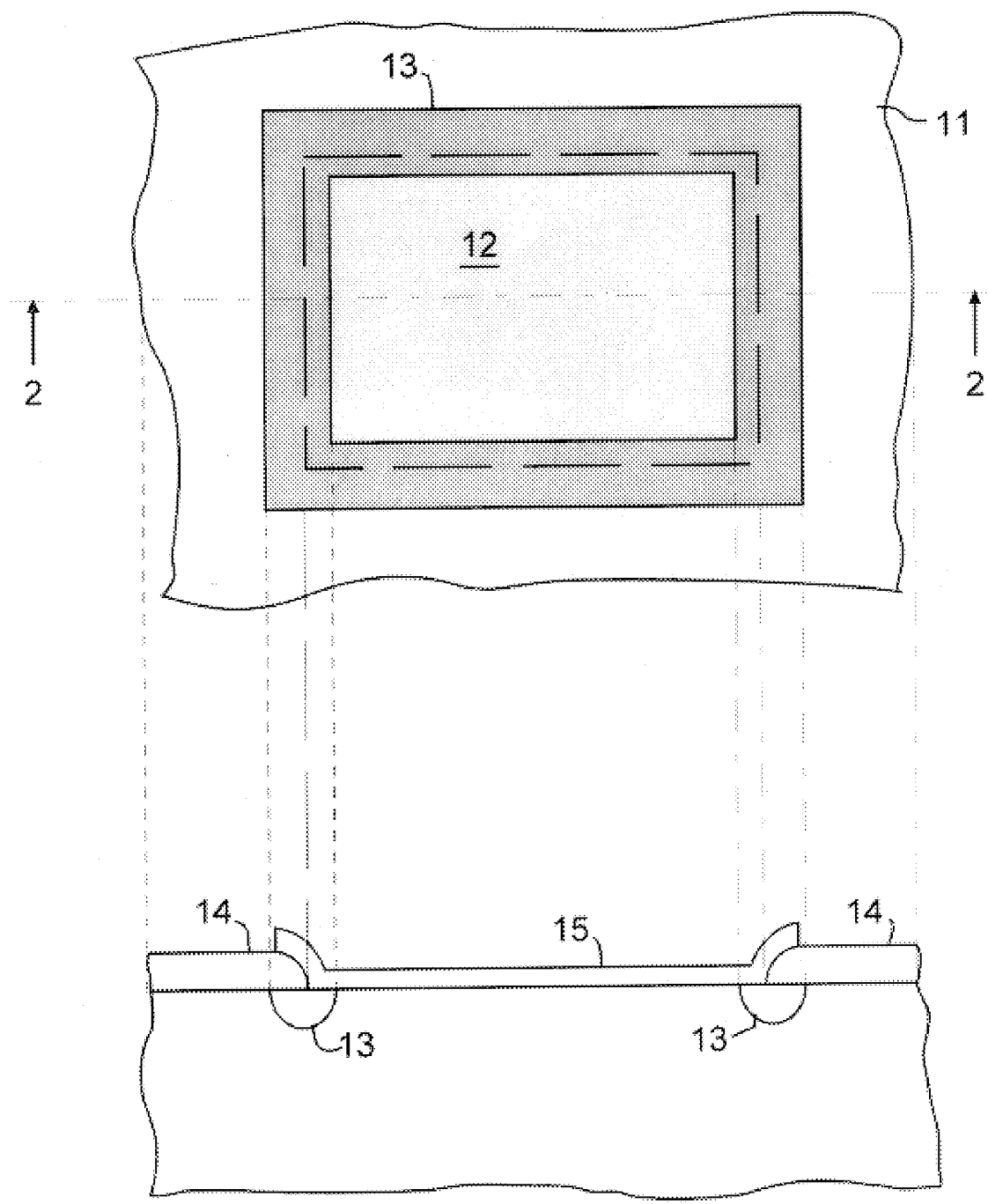
FIG. 1 is a plan view of a Schottky barrier diode with a standard junction guard ring.
FIG. 2 is a sectional view through 2—2 of FIG. 1.

FIG. 1 shows a conventional junction guarded Schottky diode with a portion of a semiconductor substrate shown at 11, Schottky barrier active region at 12, and junction guard ring 13. The actual guard ring in this view is below the metal contact, and the detail of the structure can be more easily appreciated in the view of FIG. 2, which is a sectional view along 2—2 of FIG. 1. FIG. 2 shows the field oxide 14, and metal contact 15 covering Schottky barrier region 12, and extending over the edge of the field oxide as shown. The term "ring" is conventionally used, and is used herein, to describe a structure that surrounds the Schottky barrier. In some embodiments it may be circular, but in practical embodiments tends to be polygonal- and typically quadrilateral-shaped. The Schottky barrier in the context of the invention is typically formed by a silicide layer which, for clarity, is not shown here.

The object of the invention is to distribute the guard ring so as to achieve both leakage control and reduce carrier injection from the junction of the guard ring into the cathode region below the Schottky barrier. Accordingly, the guard ring and the Schottky barrier are separated throughout most of the perimeter of the guard ring, and connected only along a portion sufficient to provide electrical contact between the Schottky barrier and the guard ring. In forward bias, the forward potential of the ring becomes less due to the series resistance of the ring itself as we move away from the contact point. The portions of the ring that are separated from the Schottky barrier are not turned on as hard thus reducing minority carrier injection below the active barrier region (the cathode region). In reverse bias, the doping and geometry of the non-connecting portion can be adjusted so that the depletion region extends through this region before breakdown of the sharp edge portions occurs. This allows the breakdown characteristics of the device to approximate those of the conventional full guard ring of FIGS. 1 and 2.

With reference to FIG. 3, the major portion of the p-n junction guard ring, designated 22, is spatially separated from the Schottky barrier formed beneath the metal contact 15 as shown in FIG. 4. FIG. 4 is a sectional view along 4—4 of FIG. 3. The separation is shown clearly in FIG. 4 with the spatial separation designated "x". An edge portion 21 of the Schottky barrier is made to overlap the p-n junction guard ring as in FIGS. 1 and 2. In a normal Schottky diode device design, the spacing "x" to be effective should be at least 0.2 $\mu$m, and will typically be in the range 0.2–2.0 $\mu$m.

Another embodiment of the invention is shown in FIGS. 5 and 6. Here the contact between the p-n junction guard ring and the Schottky barrier is further reduced, and comprises a tab section 31. The dominant portion of the guard ring 13, i.e. portion 32, is spaced from the Schottky barrier by distance x as seen in FIG. 6. FIG. 6 is a sectional view along 6—6 of FIG. 5.

Yet another modification according to principle embodied in the device of FIGS. 5 and 6 is shown in FIGS. 7 and 8. Here four tabs 41 effectively interconnect the guard ring and Schottky barrier. The tabs are located at the corners of the Schottky contact where sharp edge breakdown is most severe.

The extent of the connecting portions 21 in FIG. 3, 31 in FIG. 5, and 41 in FIG. 7 can be used to finely tune the tradeoff between isolation of the Schottky barrier (leakage control) and breakdown. The tradeoff can be represented as $p_1 < p_2$, where $p_1$ is the linear portion of the perimeter of the connecting portion, i.e. the overlap of the guard ring and the active Schottky region, and $p_2$ is the portion of the p-n junction guard ring that is spaced from the active Schottky region, i.e. does not overlap. It should be understood that the linear portions $p_1$ and $p_2$ refer to the inside perimeter of the guard ring. The outside perimeter of the guard ring is not relevant to the principles being described. For the purposes of the invention $p_1$ and $p_2$ typically will have values represented by:

$p_1 = 0.01$–$0.7$ $p_2$, and preferably, $0.05$–$0.25$ $p_2$

It will be recognized by those skilled in the art that when operated in reverse bias, the depletion region of the Schottky barrier diode will increase, and should be taken into account in designing the device. For example, a diode operated in reverse bias should have x<d, where d is the lateral dimension of the depletion region.

It will also be recognized by those skilled in the art that the non-connecting portion 22 (FIG. 3), 32 (FIGS. 5 and 7), may itself invert due to the field effect from the electrode contact to the Schottky barrier. This effect is illustrated in FIG. 9, where the metal silicide forming the Schottky junction is shown at 73 and the metal electrode at 74. The semiconductor substrate, the guard ring, and the field oxide are shown at 71, 75, and 72 respectively. The substrate in the preferred case is silicon, and the Schottky barrier is preferably formed by a self-aligned silicide technique, known in the art as a salicide process, wherein a silicide forming metal, e.g. Pt, Pd, Co, Ta, Ti, W, is blanket deposited over the to wafer after the patterned field oxide is formed. The portion of the blanket deposited metal that contacts the silicon substrate (or epitaxial silicon) in the field oxide window converts to silicide on heating, and the unreacted metal, covering the field oxide, is selectively removed by known techniques. The metal electrode 74 is then formed to contact the silicide. The metal electrode may be any conventional contact material such as Ti-Pd-Au, but is preferably aluminum. The metal contact 74 is not self aligned to the window as is the silicide 73, and deliberately extends up over the edge of the field oxide, and over at least the edge of the guard ring, as shown. The doping level in substrate 71 and the thickness t of the field oxide 72 may be such that the portion of the substrate which forms the isolation region between the Schottky junction depletion region 76 and the p-n junction guard ring 75, itself inverts when a sufficient bias is applied to electrode 74. While this might appear to defeat the objective of the invention, in practice it forms an extension of the guard ring at low reverse bias so that this depletion layer connection between the p-n junction guard ring and the Schottky junction forms before sharp edge breakdown of the Schottky junction, and helps control leakage and breakdown voltage much as a fully guarded device.

An embodiment of the invention using the principle described by FIG. 9 is shown in FIGS. 10 and 11. In FIG. 10 the separation between the physical p-n junction guard ring 75 and the edges of the Schottky barrier 73 is shown at 77 and surrounds the entire barrier. The electrode 74 overlies the gap ("x").

In the embodiment of FIGS. 10 and 11 the depletion effect described earlier, with overlap between the depletion layer and the guard ring, can be combined with the inversion effect just described in various ways that will become apparent to those skilled in the art.

A typical device made according to FIGS. 10 and 11 has these features. The substrate 71 is n-type epitaxial silicon doped to $5E^{15}/cm^3$. The silicide 73 is platinum silicide with an area approximately 600 $\mu m^2$. The guard ring 75 is p-type (boron) doped to $4E^{16}/cm^3$, and has a width of 1–10 $\mu m$, e.g. approximately 2.0 $\mu m$. The field oxide 72 is and 1000 Angstroms of $Si_3N_4$ over 1000 Angstroms of $SiO_2$. The metal electrode 74 is a composite TiN/Al/TiN layer with a thickness in the range 0.5–2.0 $\mu m$, e.g. approximately 1.1 $\mu m$. The spacing "x" for this embodiment of the invention is preferably in the range 0.3–2.0 $\mu m$.

The device structure of FIGS. 10 and 11 can be expressed in general terms as a device with a Schottky barrier having perimeter $p_S$ surrounded by a p-n junction guard ring having perimeter $p_G$, and wherein the perimeter $P_S$ is spaced laterally from perimeter $P_G$ essentially throughout its length.

This embodiment of the invention can also be expressed as a Schottky barrier device in which a p-n junction guard ring and a Schottky barrier are connected by an MOS gate, with the gate dielectric formed by the field insulator and the gate electrode formed by the Schottky barrier electrode. With reference to FIG. 9, it will be recognized that the Schottky barrier electrode 74 should overlap the field oxide 72 by a distance of at least "x".

Figure 12:
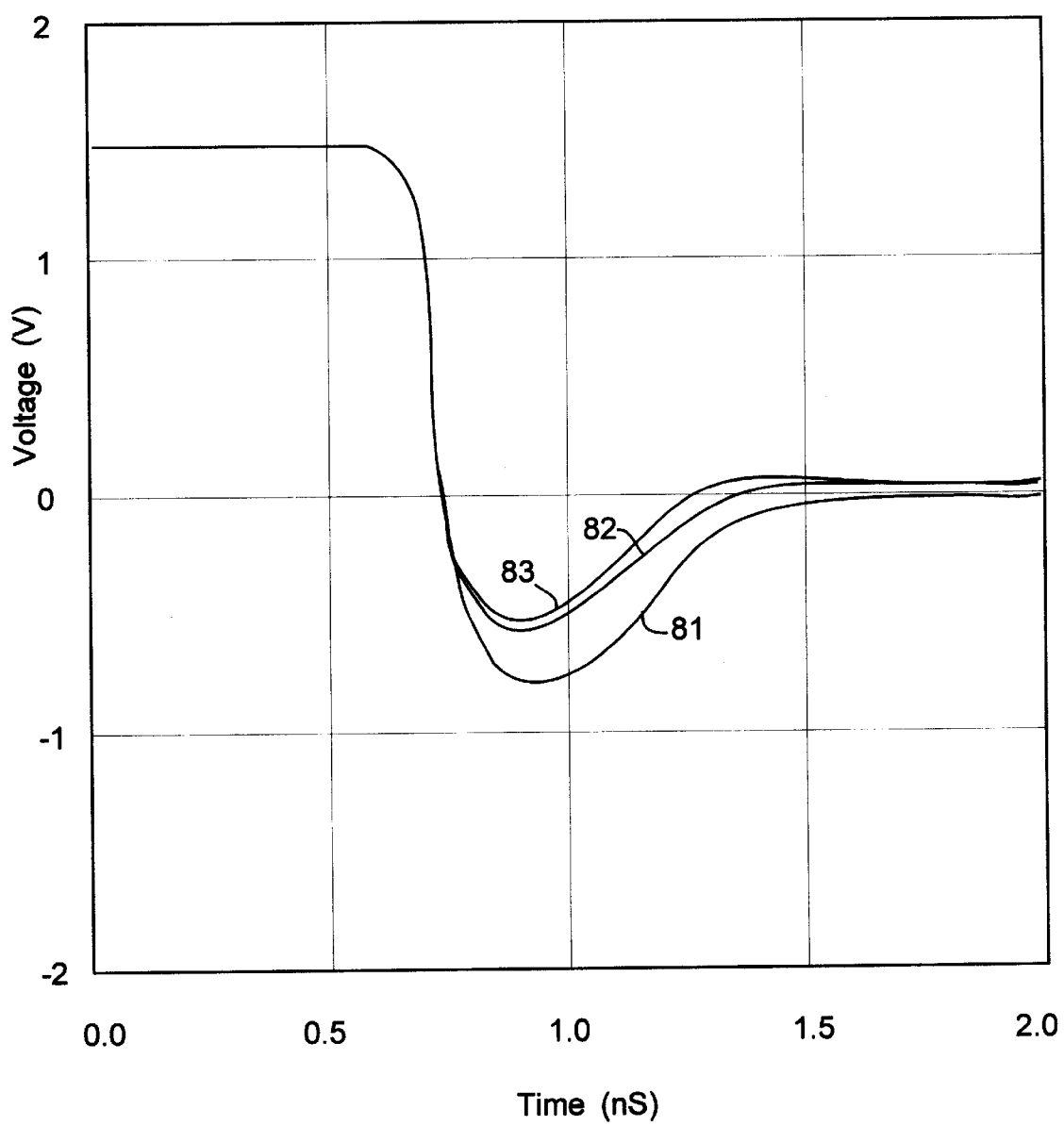
FIG. 12 is a plot showing reverse recovery time for devices made in accordance with the invention.

The recovery time characteristics for devices made according to the invention are shown in FIG. 12 where response of voltage in volts is plotted vs. time (in nanoseconds) at the 50 ohm input of a monitor oscilloscope that monitors the Schottky current during switching. Reverse recovery time is derived from this plot. The data is for a 24.5 $\mu m$ square barrier with forward current, $I_f$=30 mA and reverse current, $I_r$=16 mA. Trace 81 is for a conventional device, i.e. the device of FIGS. 1 and 2. Trace 82 represents the breakdown characteristic for devices with partial overlap between the guard ring and the Schottky barrier, i.e. devices made in accordance with FIGS. 3–8. A similar recovery time characteristic is obtained with a device made in accordance with FIGS. 10 and 11, with a separation "x" of 0.5 $\mu m$. Trace 83 represents the breakdown characteristics for a device made in accordance with FIGS. 10 and 11, with a separation "x" of approximately 1.0 $\mu m$.

It will be understood by those skilled in the art that reference to substrates herein and in the appended claims may refer to a bulk semiconductor wafer or may refer to a semiconductor wafer with an epitaxial semiconductor layer. Whereas this description is largely in terms of silicon devices, other semiconductor junction devices, with e.g. GaAs, or other III-V binary, ternary or quaternary compounds, may also be treated in accordance with the principles of the invention.

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. A Schottky barrier device comprising:
   (a) a semiconductor substrate,
   (b) a Schottky barrier layer on said substrate, said Schottky barrier layer having an area A, and a perimeter p,
   (c) a p-n junction guard ring surrounding said area A, said p-n junction guard ring having an inside perimeter and an outside perimeter, with a first portion $p_1$ of the inside perimeter of said guard ring overlapping said perimeter p, and a second portion $p_2$ of the inside perimeter of said guard ring space d from said perimeter p, and wherein $p_1$=0.01–0.7 $p_2$.

2. The device of claim 1 wherein $p_1$=0.05–0.25 $p_2$.

3. The device of claim 2 wherein the substrate is silicon.

4. The device of claim 3 wherein the Schottky barrier layer is a silicide.

* * * * *